(12) United States Patent
Wang et al.

(10) Patent No.: US 10,056,398 B1
(45) Date of Patent: Aug. 21, 2018

(54) METHOD OF FORMING SPLIT-GATE, TWIN-BIT NON-VOLATILE MEMORY CELL

(71) Applicant: Silicon Storage Technology, Inc., San Jose, CA (US)

(72) Inventors: Chunming Wang, Shanghai (CN); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 15/945,659

(22) Filed: Apr. 4, 2018

Related U.S. Application Data

(62) Division of application No. 15/476,663, filed on Mar. 31, 2017, now Pat. No. 9,972,632.

(30) Foreign Application Priority Data

Apr. 29, 2016 (CN) .......................... 2016 1 0285454

(51) Int. Cl.
| | |
|---|---|
| *H01L 27/11521* | (2017.01) |
| *G11C 16/04* | (2006.01) |
| *H01L 29/423* | (2006.01) |
| *G11C 16/16* | (2006.01) |
| *G11C 16/10* | (2006.01) |

(52) U.S. Cl.
CPC .... *H01L 27/11521* (2013.01); *G11C 16/0433* (2013.01); *G11C 16/10* (2013.01); *G11C 16/16* (2013.01); *H01L 29/42328* (2013.01)

(58) Field of Classification Search
CPC ......... H01L 27/11521; H01L 29/42328; H01L 29/66825; H01L 29/788; H01L 29/6653; H01L 29/0847; H01L 27/075; G11C 16/0433; G11C 2216/10
See application file for complete search history.

(56) References Cited

U.S. PATENT DOCUMENTS

| | | | |
|---|---|---|---|
| 6,747,310 | B2 | 6/2004 | Fan et al. |
| 7,046,552 | B2 | 5/2006 | Chen et al. |
| 7,718,488 | B2 | 5/2010 | Chen et al. |
| 8,325,521 | B2 | 12/2012 | Hsieh |
| 8,780,625 | B2 | 7/2014 | Gu et al. |
| 2003/0209751 | A1 | 11/2003 | Harari |
| 2005/0012137 | A1 | 1/2005 | Levi |
| 2014/0126299 | A1 | 5/2014 | Fukumoto |
| 2014/0203343 | A1 | 7/2014 | Wang |
| 2016/0163722 | A1* | 6/2016 | Chang ............... H01L 27/11521 257/316 |
| 2017/0012049 | A1 | 1/2017 | Yang |

* cited by examiner

*Primary Examiner* — David Lam
(74) *Attorney, Agent, or Firm* — DLA Piper LLP (US)

(57) ABSTRACT

A memory device that includes a substrate of semiconductor material of a first conductivity type, first and second regions spaced apart in the substrate and having a second conductivity type different than the first conductivity type, with a continuous channel region in the substrate extending between the first and second regions. A first floating gate is disposed over and insulated from a first portion of the channel region adjacent to the first region. A second floating gate is disposed over and insulated from a second portion of the channel region adjacent to the second region. A word line gate is disposed over and insulated from a third portion of the channel region between the first and second channel region portions. A first erase gate disposed over and insulated from the first region. A second erase gate disposed is over and insulated from the second region.

9 Claims, 26 Drawing Sheets

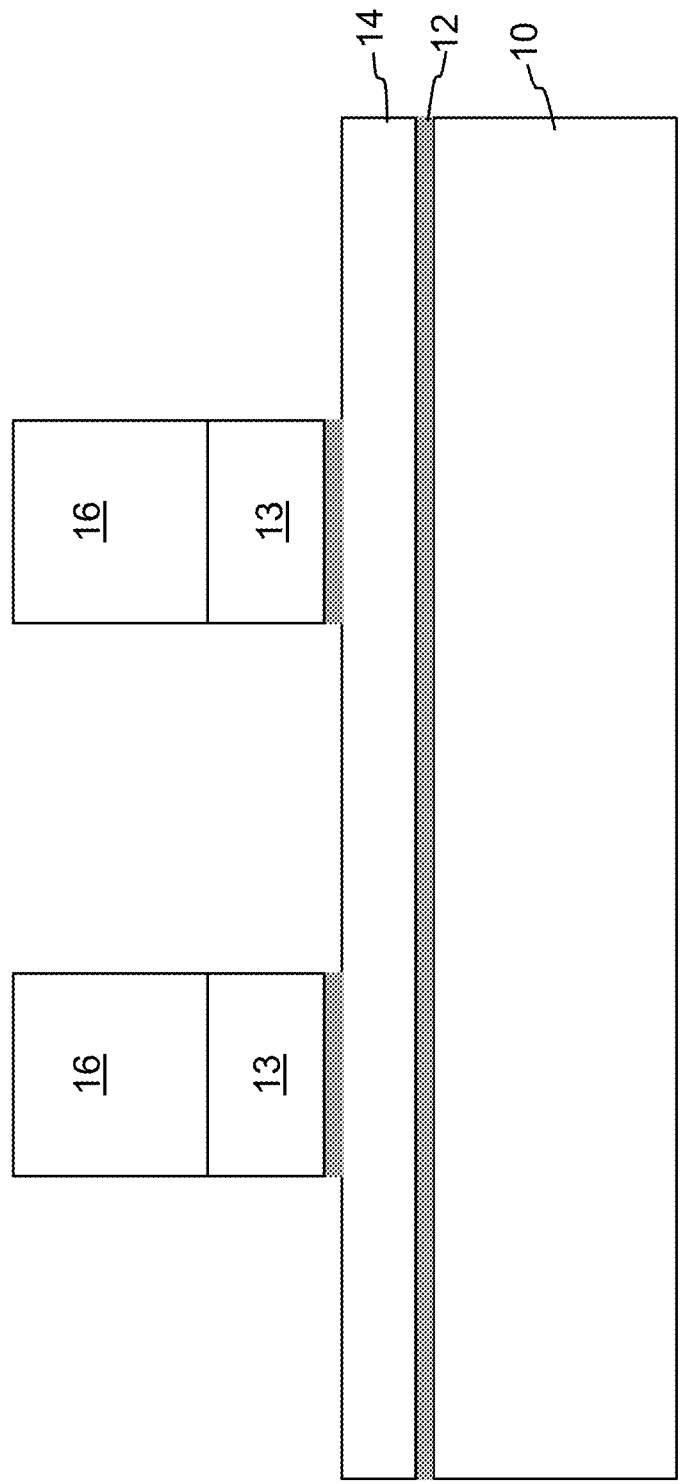

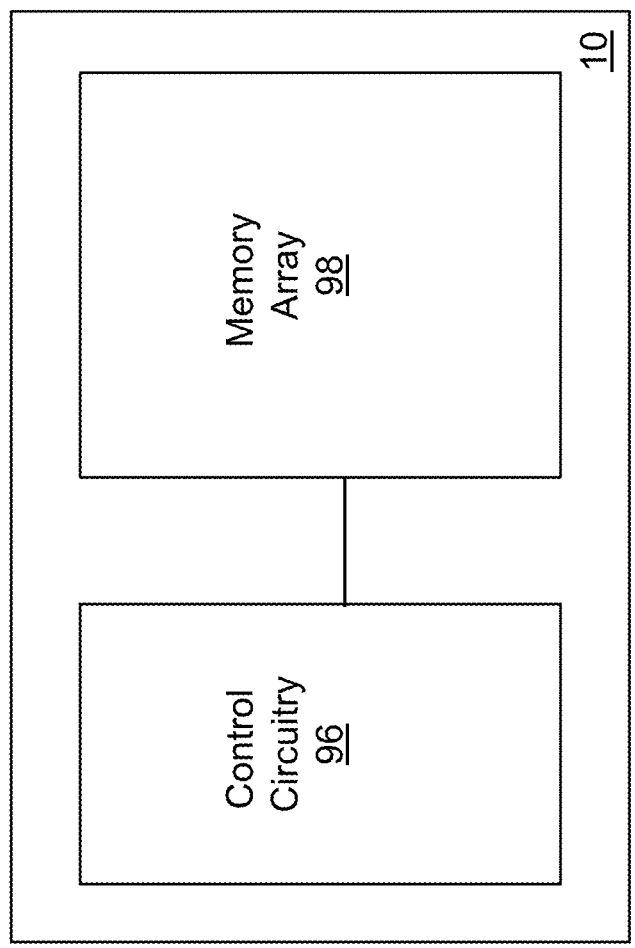

US 10,056,398 B1

METHOD OF FORMING SPLIT-GATE, TWIN-BIT NON-VOLATILE MEMORY CELL

RELATED APPLICATION

This application is a divisional of U.S. patent application Ser. No. 15/476,663, filed Mar. 31, 2017, now U.S. Pat. No. 9,972,632 which claims the benefit of Chinese Patent Application No. 201610285454.7 filed on Apr. 29, 2016.

FIELD OF THE INVENTION

The present invention relates to non-volatile memory arrays.

BACKGROUND OF THE INVENTION

Split gate non-volatile flash memory cells are well known. For example, U.S. Pat. No. 6,747,310 discloses such memory cells having source and drain regions defining a channel region there between, a select gate over one portion of the channel regions, a floating gate over the other portion of the channel region, and an erase gate over the source region. The memory cells are formed in pairs that share a common source region and common erase gate, with each memory cell having its own channel region in the substrate extending between the source and drain regions (i.e. there are two separate channel regions for each pair of memory cells). The lines connecting all the control gates for memory cells in a given column run vertically. The same is true for the lines connecting the erase gates and the select gates, and the source lines. The bit lines connecting drain regions for each row of memory cells run horizontally.

Each memory cell stores a single bit of information (based on the programming state of the floating gate). Given the number of electrodes for each cell (source, drain, select gate, control gate and erase gate), and two separate channel regions for each pair of memory calls, configuring and forming the architecture and array layout with all the various lines connected to these electrodes can be overly complex and difficult to implement, especially as critical dimensions continue to shrink.

One solution is to eliminate the source region, and have both memory cells share a single continuous channel region and a common word line gate, and disclosed in U.S. Pat. No. 8,780,625. However, there are performance limitations with this configuration because, among other things, it lacks erase gates.

BRIEF SUMMARY OF THE INVENTION

The aforementioned problems and needs are addressed by a method of forming a pair of non-volatile memory cells includes forming a first insulation layer on a semiconductor substrate, forming a first polysilicon layer on the first insulation layer in a first polysilicon deposition process, forming spaced apart first and second insulation blocks on the first polysilicon layer, the first insulation block having a first side facing the second insulation block and a second side facing away from the second insulation block, and the second insulation block having a first side facing the first insulation block and a second side facing away from the first insulation block, removing a portion of the first polysilicon layer disposed between the first and second insulation blocks while maintaining portions of the first polysilicon layer disposed underneath the first and second insulation blocks and adjacent the second sides of the first and second insulation blocks, removing the portions of the first polysilicon layer adjacent the second sides of the first and second insulation blocks while maintaining a pair of polysilicon blocks of the first polysilicon layer each disposed under one of the first and second insulation blocks, forming a first drain region in the substrate and adjacent the second side of the first insulation block, forming a second drain region in the substrate and adjacent the second side of the second insulation block, forming a second polysilicon layer over the substrate and the first and second insulation blocks in a second polysilicon deposition process, and removing portions of the second polysilicon layer while maintaining a first polysilicon block, a second polysilicon block and a third polysilicon block of the second polysilicon layer. The first polysilicon block is disposed between the first and second insulation blocks, the second polysilicon block is disposed over the first drain region, and the third polysilicon block is disposed over the second drain region. The substrate includes a continuous channel region extending between the first and second drain regions.

A method of forming a pair of non-volatile memory cells includes forming a first insulation layer on a semiconductor substrate, forming a first polysilicon layer on the first insulation layer in a first polysilicon deposition process, forming an insulation layer stack on the first polysilicon layer, forming a second polysilicon layer on the insulation layer stack, forming spaced apart first and second insulation blocks on the second polysilicon layer, the first insulation block having a first side facing the second insulation block and a second side facing away from the second insulation block, and the second insulation block having a first side facing the first insulation block and a second side facing away from the first insulation block, removing portions of the second polysilicon layer, the insulation layer stack and the first polysilicon layer disposed between the first and second insulation blocks and adjacent the second sides of the first and second insulation blocks, while maintaining a pair of polysilicon blocks of the first polysilicon layer each disposed under one of the first and second insulation blocks, forming a first drain region in the substrate and adjacent the second side of the first insulation block, forming a second drain region in the substrate and adjacent the second side of the second insulation block, forming a third polysilicon layer over the substrate and the first and second insulation blocks in a second polysilicon deposition process, and removing portions of the third polysilicon layer while maintaining a first polysilicon block, a second polysilicon block and a third polysilicon block of the third polysilicon layer. The first polysilicon block is disposed between the first and second insulation blocks, the second polysilicon block is disposed over the first drain region, and the third polysilicon block is disposed over the second drain region. The substrate includes a continuous channel region extending between the first and second drain regions.

Other objects and features of the present invention will become apparent by a review of the specification, claims and appended figures.

BRIEF DESCRIPTION OF THE DRAWINGS

FIGS. 4A-4D are side cross section views showing the steps in forming an alternate embodiment of the 2 bit memory cell of the present invention.

FIG. 8 is a plan view showing control circuitry used to operate an array of 2-bit memory cells of the present invention.

DETAILED DESCRIPTION OF THE INVENTION

Figure 1A:
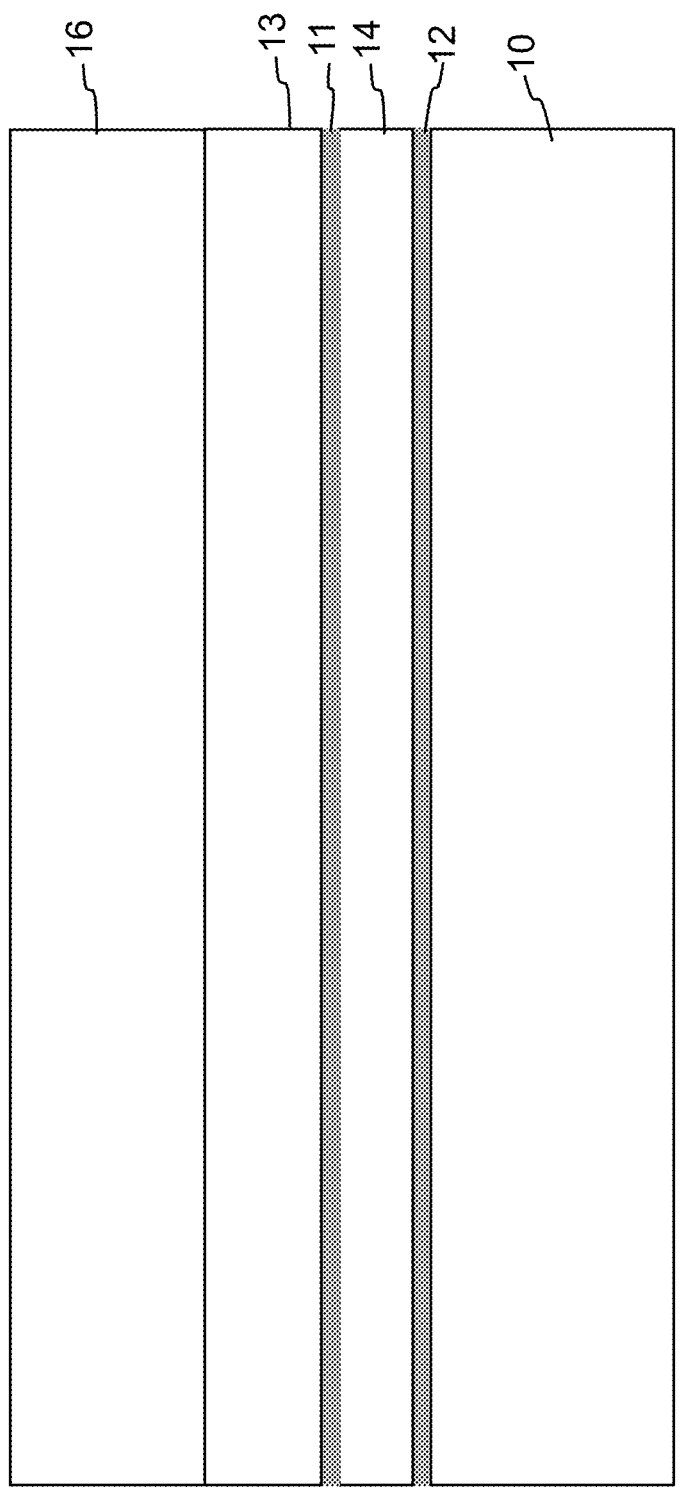
FIGS. 1A-1H are side cross section views showing the steps in forming the 2 bit memory cell of the present invention.

The present invention is a memory cell design, architecture and method of manufacture of a split-gate, two bit memory cell design. Referring to FIGS. 1A-1H, there are shown cross-sectional views of the steps in the process to make a 2-bit memory cell (while only the formation of a single 2-bit memory cell is shown in the figures, it should be understood that an array of such memory cells are formed concurrently). The process begins by forming a layer of silicon dioxide (oxide) 12 on a substrate 10 of P type single crystalline silicon. Thereafter a layer 14 of polysilicon (or amorphous silicon) is formed on the layer 12 of silicon dioxide. Then insulating stack 11 (ONO, oxide-nitride-oxide) is formed on layer 14, and a layer 13 of polysilicon (or amorphous silicon) is formed on the layer 11. Another insulating layer 16 (e.g. silicon nitride—"nitride") is formed on poly layer 13, as shown in FIG. 1A.

Figure 1B:
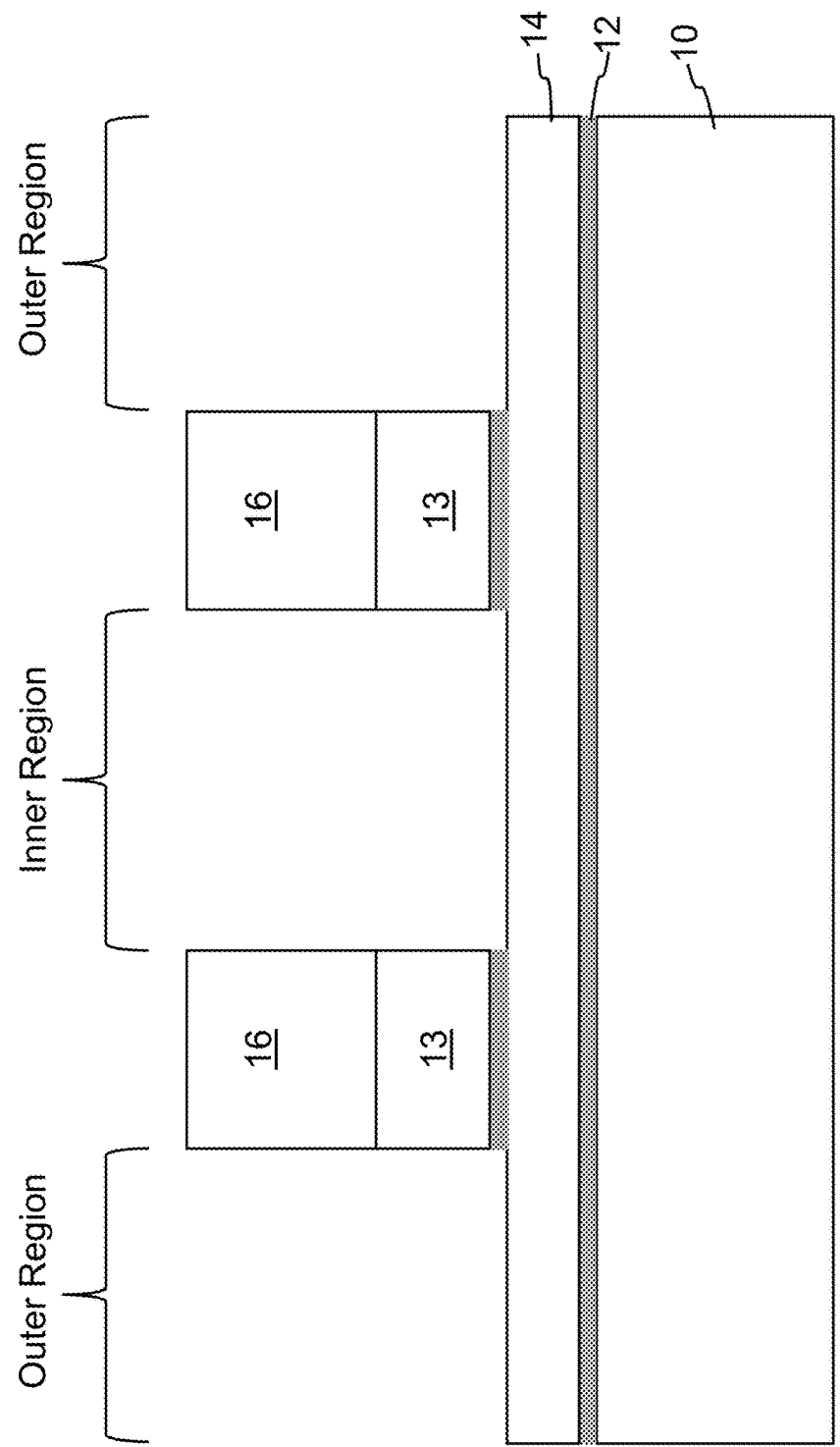
Figure 1C:
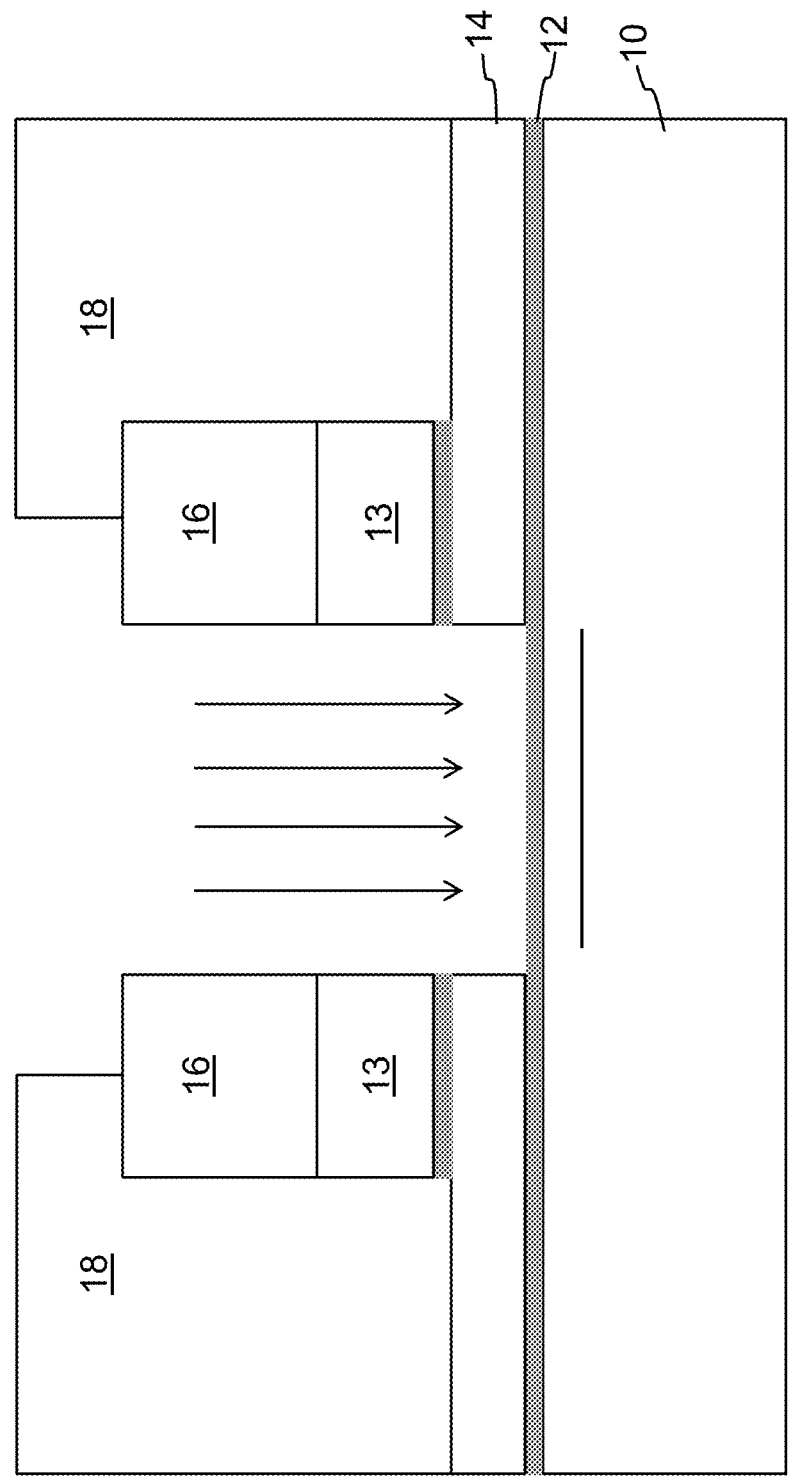

Photoresist material (not shown) is coated on the structure, and a photolithography masking step is performed exposing selected portions of the photoresist material. The photoresist is developed such that portions of the photoresist are removed. Using the remaining photoresist as a mask, the structure is etched. Specifically, nitride layer 16, poly layer 13 and insulating layer stack 11 are anisotropically etched (using poly layer 14 as an etch stop), leaving pairs of nitride blocks 16 and poly blocks 13 as shown in FIG. 1B (after the photoresist is removed). The space between nitride blocks 16 and poly blocks 13 is termed herein the "inner region," and the spaces outside of the pair of nitride blocks 16 and poly blocks 13 are termed herein the "outer regions." Photoresist material 18 is coated on the structure, and is patterned using masking and develop steps, to cover the outer regions, but leaving the inner region exposed. An anisotropic poly etch is then used to remove the portion of poly layer 14 in the inner region. A WLVT implantation is used to implant the substrate in the inner region, as illustrated in FIG. 1C.

Figure 1D:
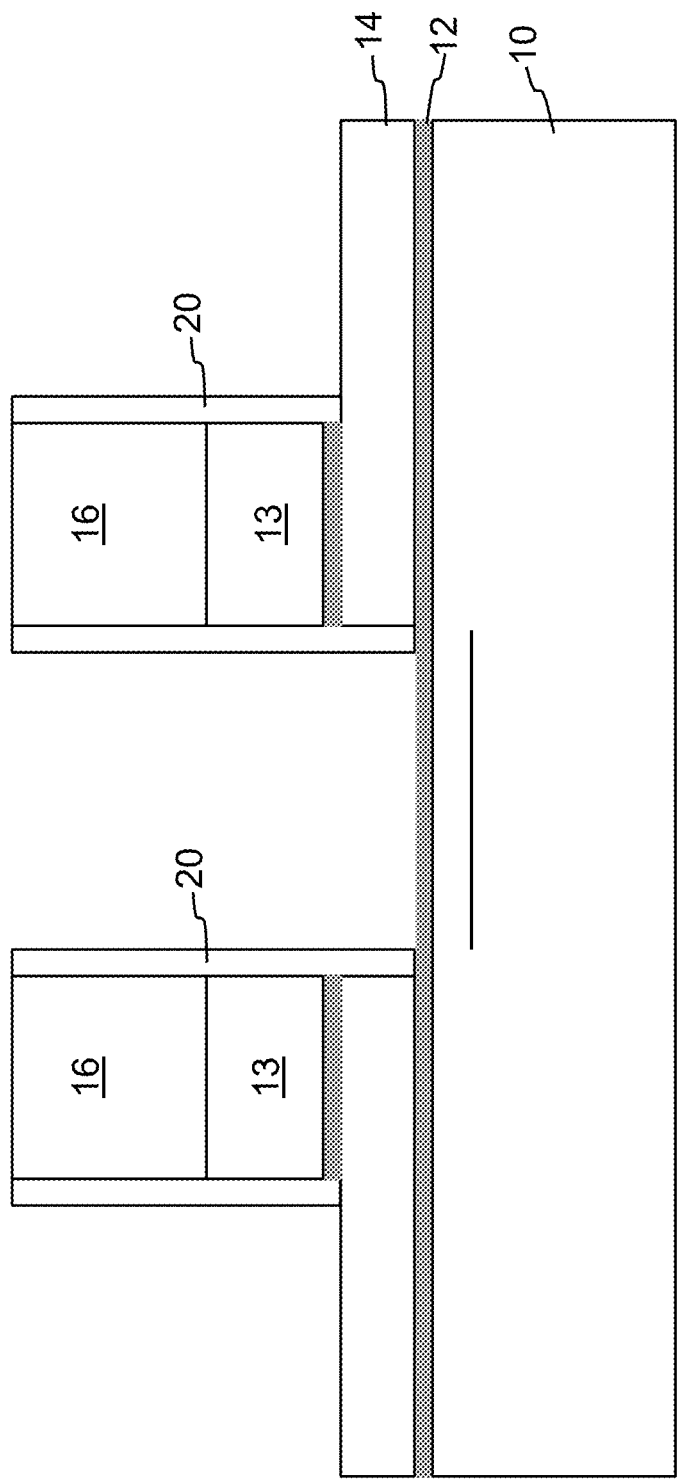
Figure 1E:
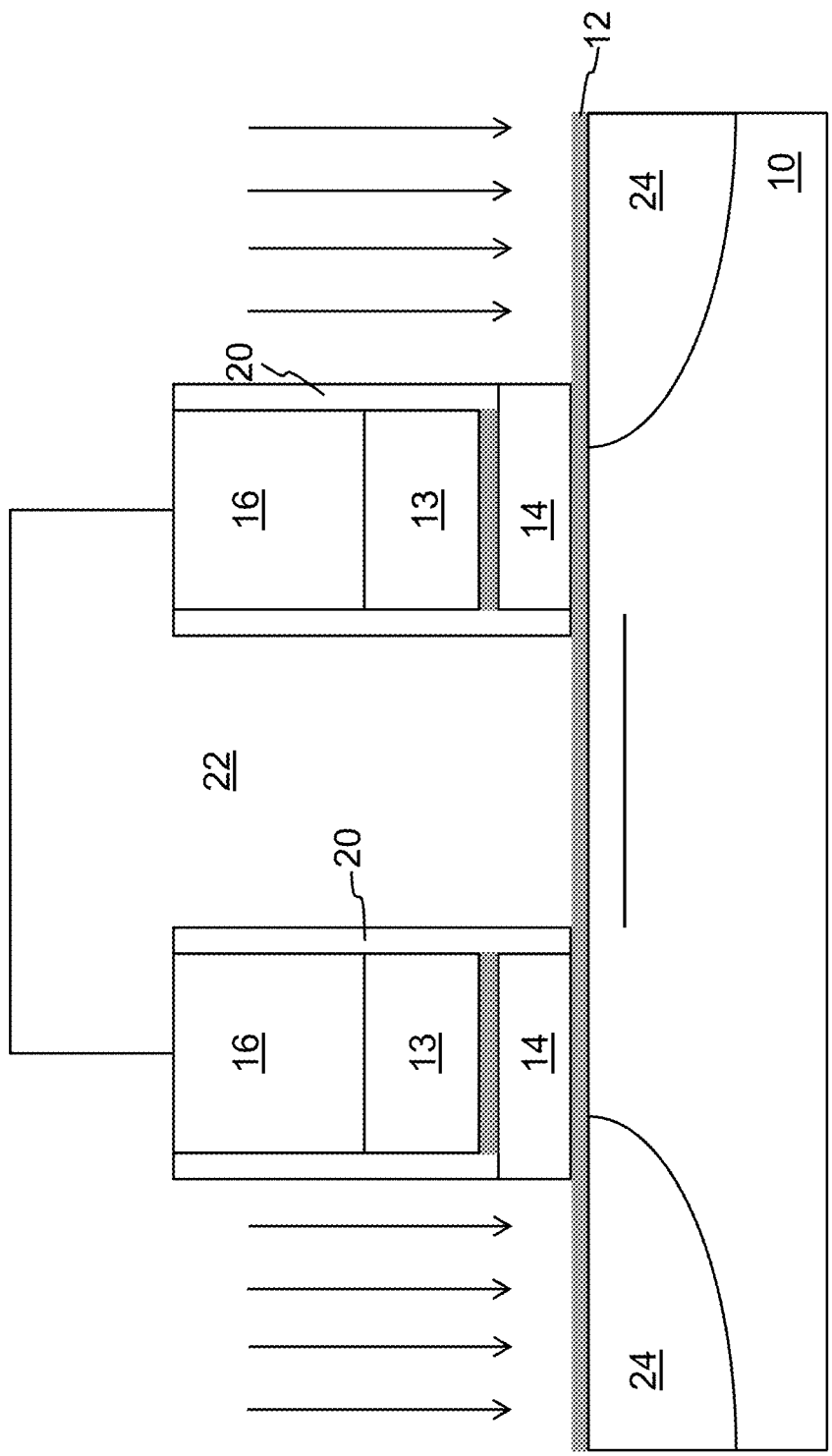

After removal of photoresist 18, spacers 20 are then formed on the sides of the structure. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure (with a rounded upper surface). Spacers 20 can be oxide or oxide-nitride. The resultant structure is shown in FIG. 1D. Photoresist material 22 is coated on the structure, and is patterned using masking and develop steps, to cover the inner region, but leaving the outer regions exposed. A poly etch is then used to remove the exposed portions of poly layer 14 in the outer regions. An implant process (e.g. implantation and anneal) is then performed to form drain regions (bit lines—BL) 24 in the substrate in the outer regions, as shown in FIG. 1E.

Figure 1F:
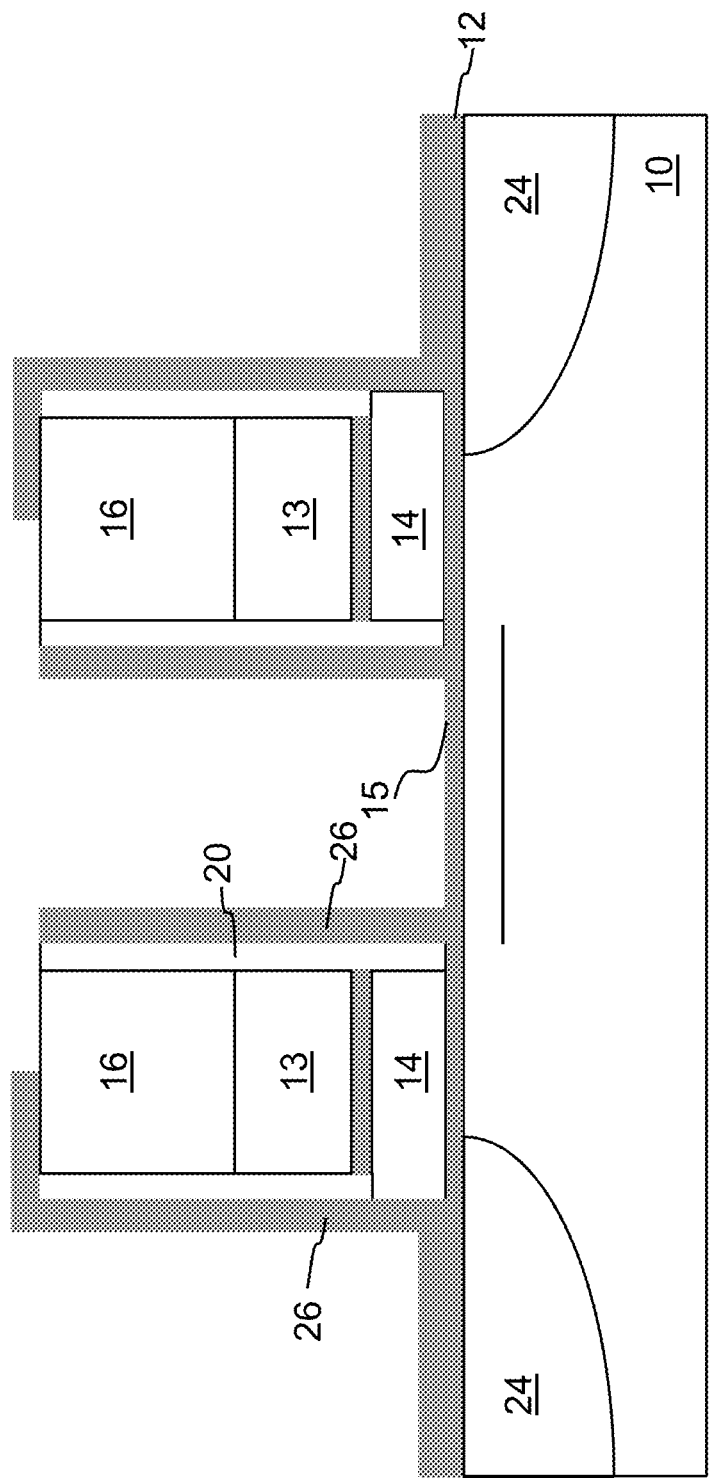
Figure 1G:
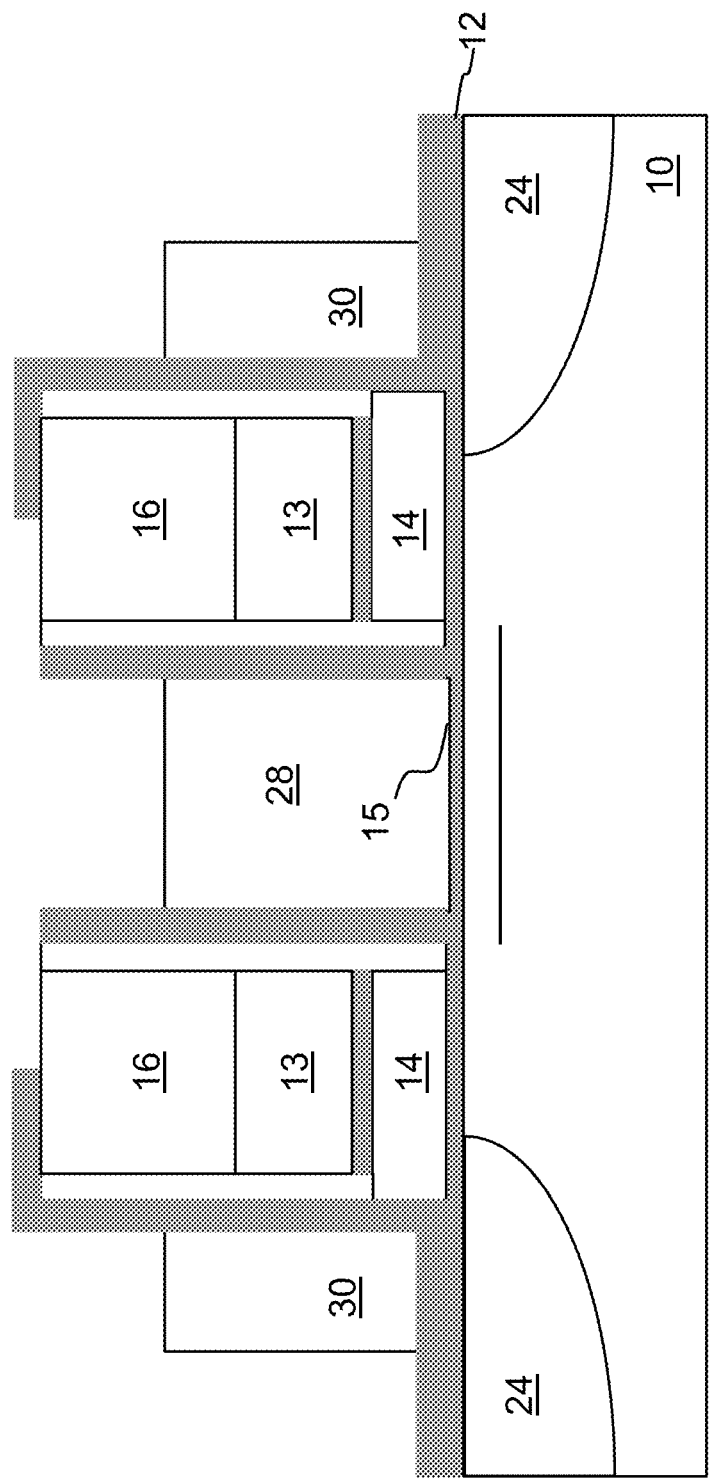

After removal of photoresist 22, an oxide layer is formed over the structure, including oxide layer 26 along the sides and top of the structures. A photoresist coating and photolithography masking step is used to cover the structure with photoresist except for the inner region. An oxide anisotropic etch (e.g. dry anisotropic etch) is then used to remove the oxide over the substrate 10. After removal of photoresist, an oxide layer 15 is grown over the structure in the inner region, which thickens oxide layer 12 over the substrate 10 in the outer regions, as shown in FIG. 1F. A polysilicon deposition and etch back is used to form a layer of polysilicon in the inner and outer regions. A photoresist coating and photolithography masking, and polysilicon etch, are used to define the outer edges of the polysilicon layer in the outer regions. The resulting structure is shown in FIG. 1G (after photoresist removal), which results in poly block 28 in the inner region and poly blocks 30 in the outer regions.

Figure 1H:
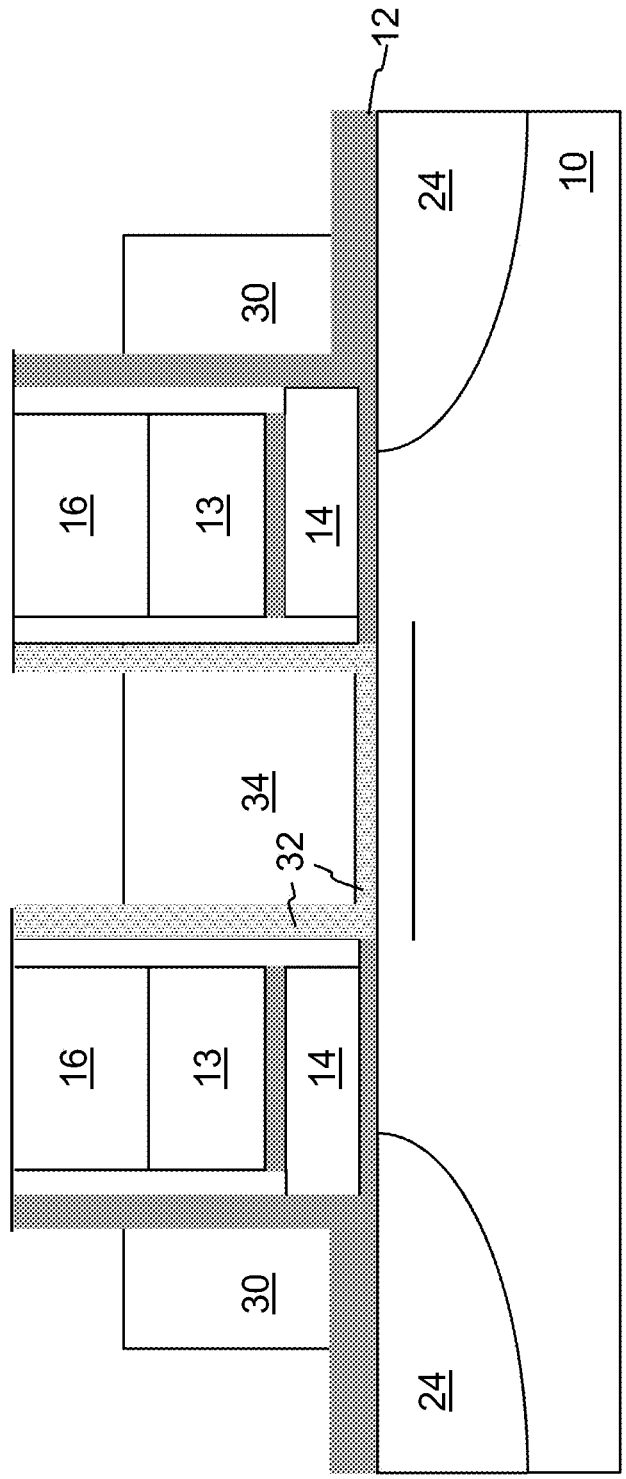

Optionally, poly block 28 can be replaced with a metal block for improved conductivity as follows. A photoresist coating and masking process are used to cover the structure with photoresist except for the inner region. Poly and oxide etches are used to remove the poly block 28 and the oxide layers 15 and 26 from the inner region. An insulation layer 32 is formed on the substrate and exposed structure sidewalls in the inner region. Layer 32 is preferably a high K material (i.e. having a dielectric constant K greater than that of oxide, such as HfO2, ZrO2, TiO2, etc.). A metal deposition and etch back are then used to form a block of metal material 34 in the inner region (i.e. on and alongside the high K insulation layer 32). Preferably, CMP is used to planarize the top surfaces. The resulting structure is shown in FIG. 1H (after photoresist removal). It should be noted that for all of the embodiments herein, the poly block between the floating gates 14 (which is the word line gate) can remain as a poly block, or can be replaced by a metal block insulated with a high K material as described above.

Figure 2:
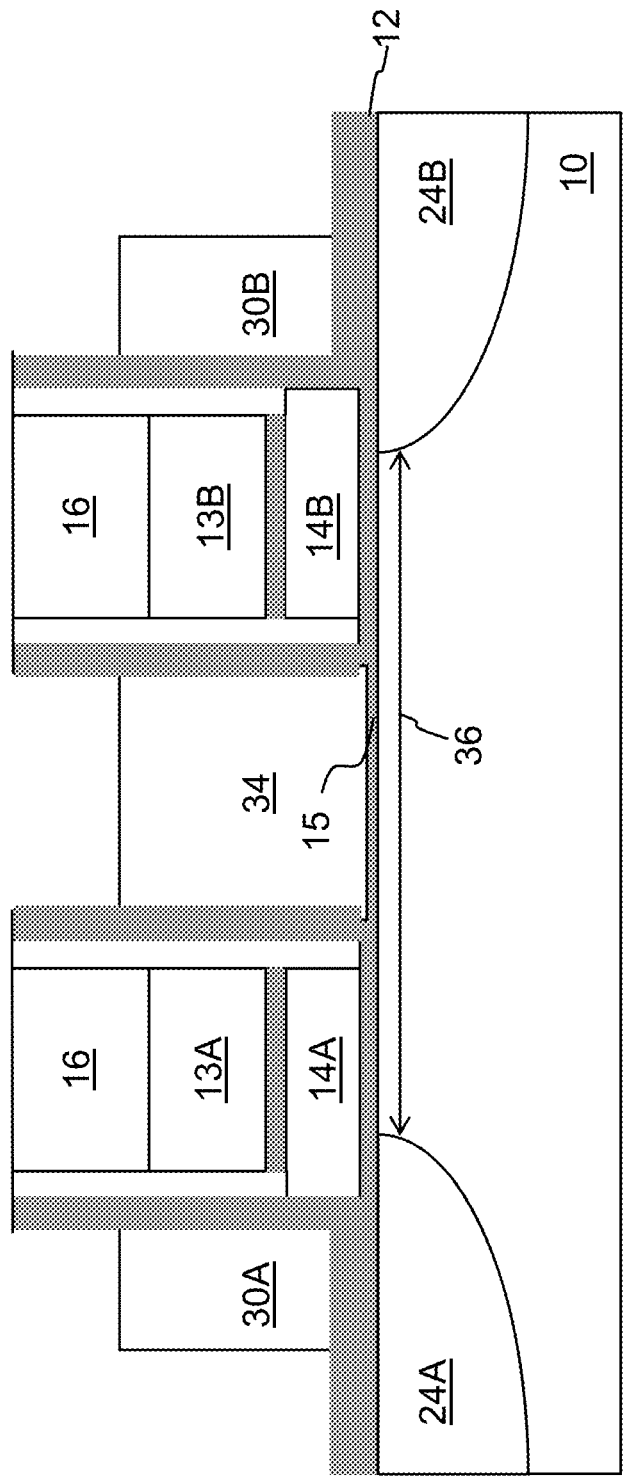
FIG. 2 is a side cross section view showing an alternate embodiment of the 2 bit memory cell of the present invention.

The final 2-bit memory cell structure is shown in FIG. 2, where a continuous channel region 36 is defined in the substrate between the two bit line (drain) regions 24A and 24B. A first floating gate 14A is disposed over and insulated from a first portion of the channel region 36 (for controlling the conductivity thereof). A first coupling gate 13A is disposed over and insulated from the first floating gate 14A (for coupling the voltage on the floating gate 14A). A word line gate 34 is disposed over and insulated from a second portion of the channel region 36 (for controlling the conductivity thereof). A second floating gate 14B is disposed over and insulated from a third portion of the channel region 36 (for controlling the conductivity thereof). A second coupling gate 13B is disposed over and insulated from the second floating gate 14B (for coupling the voltage on floating gate 14B). A first erase gate 30A is disposed over and insulated from the first drain region 24A, and disposed adjacent to and insulated from the first floating gate 14A. A second erase gate 30B is disposed over and insulated from the second drain region 24B, and disposed adjacent to and insulated from the second floating gate 14B. Programming floating gate 14A with electrons stores the first bit (i.e., bit 1), and programming floating gate 14B with electrons stores the second bit (i.e., bit 2).

Table 1 below illustrates exemplary operational voltages for program, read and erase operations of the two-bit memory cell.

TABLE 1

|  | EG 30A | EG 30B | WL 28 | CG 13A | CG 13B | BL 24A | BL 24B |
|---|---|---|---|---|---|---|---|
| Program bit 1 | 4.5 V | 0 | 1 V | 10.5 V | 4.5 V | 4.5 V | −1 uA |
| Program bit 2 | 0 | 4.5 V | 1 V | 4.5 V | 10.5 V | −1 uA | 4.5 V |
| Read bit 1 | 0 | 0 | Vcc | 0 | 4.5 V | 0 | 1 V |
| Read bit 2 | 0 | 0 | Vcc | 4.5 V | 0 | 1 V | 0 |
| Erase both bits | 8.5 V | 8.5 V | 0 | −7 V | −7 V | 0 | 0 |

To program floating gate 14A, voltage 4.5V is applied to erase gate 30A and voltage 10.5V is applied to coupling gate 13A which are capacitively coupled to floating gate 14A. A voltage of 1V is applied to the word line gate 34 which turns on the underlying channel portion. Voltage 4.5V is applied to coupling gate 13B which is capacitively coupled to floating gate 14B to turn on the underlying channel portion. Voltage 4.5V is applied to bit line 24A and −1 uA on bit line 24B. Electrons travel from bit line 24B toward bit line 24A, and inject themselves onto floating gate 14A because of the positive voltage capacitively coupled thereto by erase gate 30A. Floating gate 14B is similarly programmed.

To erase the floating gates 14A and 14B, a voltage of 8.5 volts is applied to the erase gates 30A and 30B, and a negative voltage of −7V is applied to the coupling gate 13A and 13B, which causes electrons to tunnel through the insulation from the floating gates 14 to the erase gates 30.

To read floating gate 14A, Vcc is applied to word line 34 which turns on the underlying channel portion. A voltage of 1V is applied to the bit line 24B and zero volts applied to bit line 24A. A 4.5V voltage is applied to coupling gate 13B, which is capacitively coupled to floating gate 14B (turning on the underlying channel region portion). Current will flow through the channel if floating gate 14A is erased (i.e., erased state will have a positive voltage on floating gate 14A and therefore the underlying channel region portion is turned on), and current will not flow through the channel if floating gate 14A is programmed (i.e. is programmed with electrons sufficient to prevent turning on the underlying channel region portion). Floating gate 14B is similarly read.

Figure 3A:
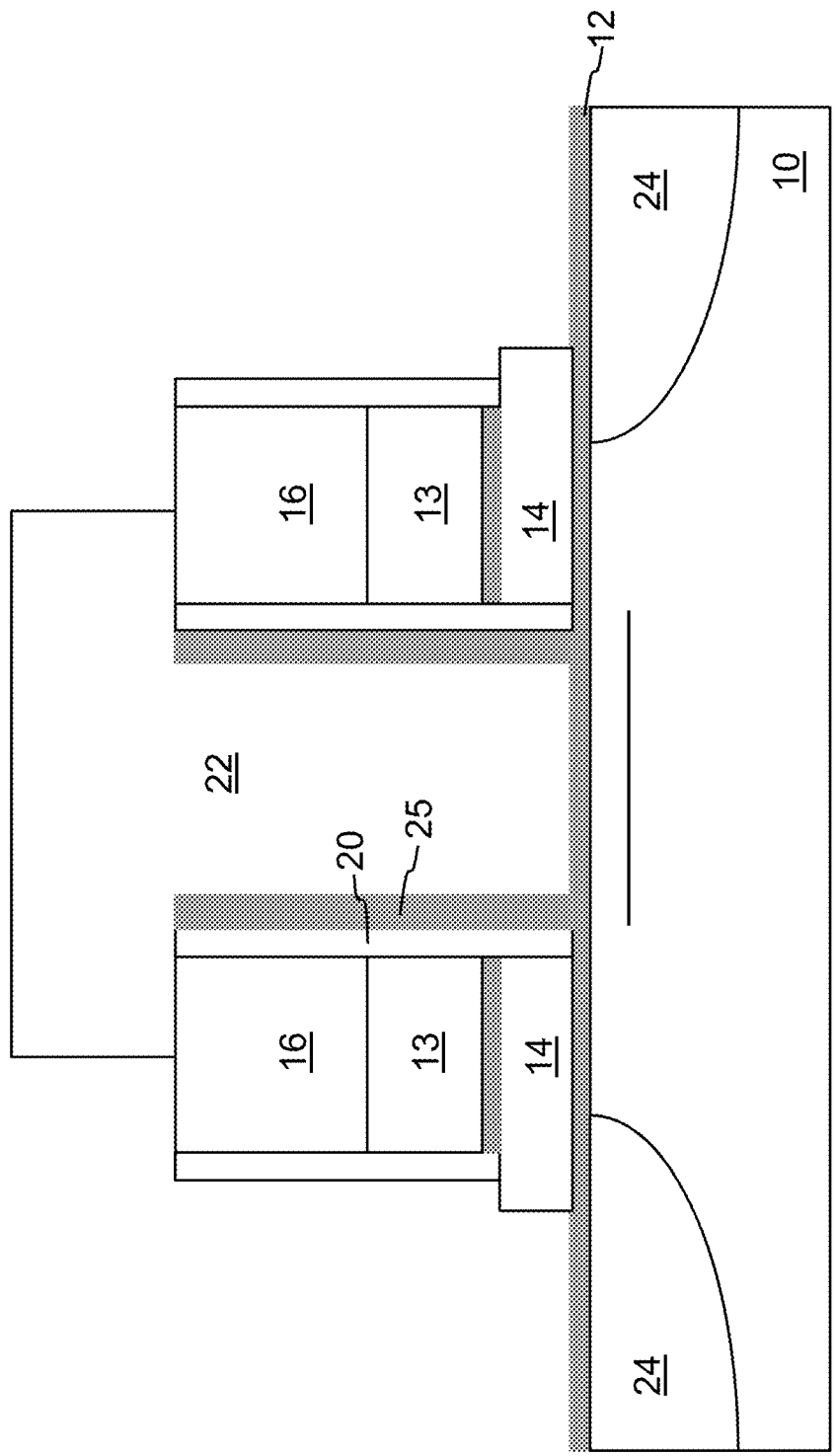
FIGS. 3A-3C are side cross section views showing the steps in forming an alternate embodiment of the 2 bit memory cell of the present invention.
Figure 3B:
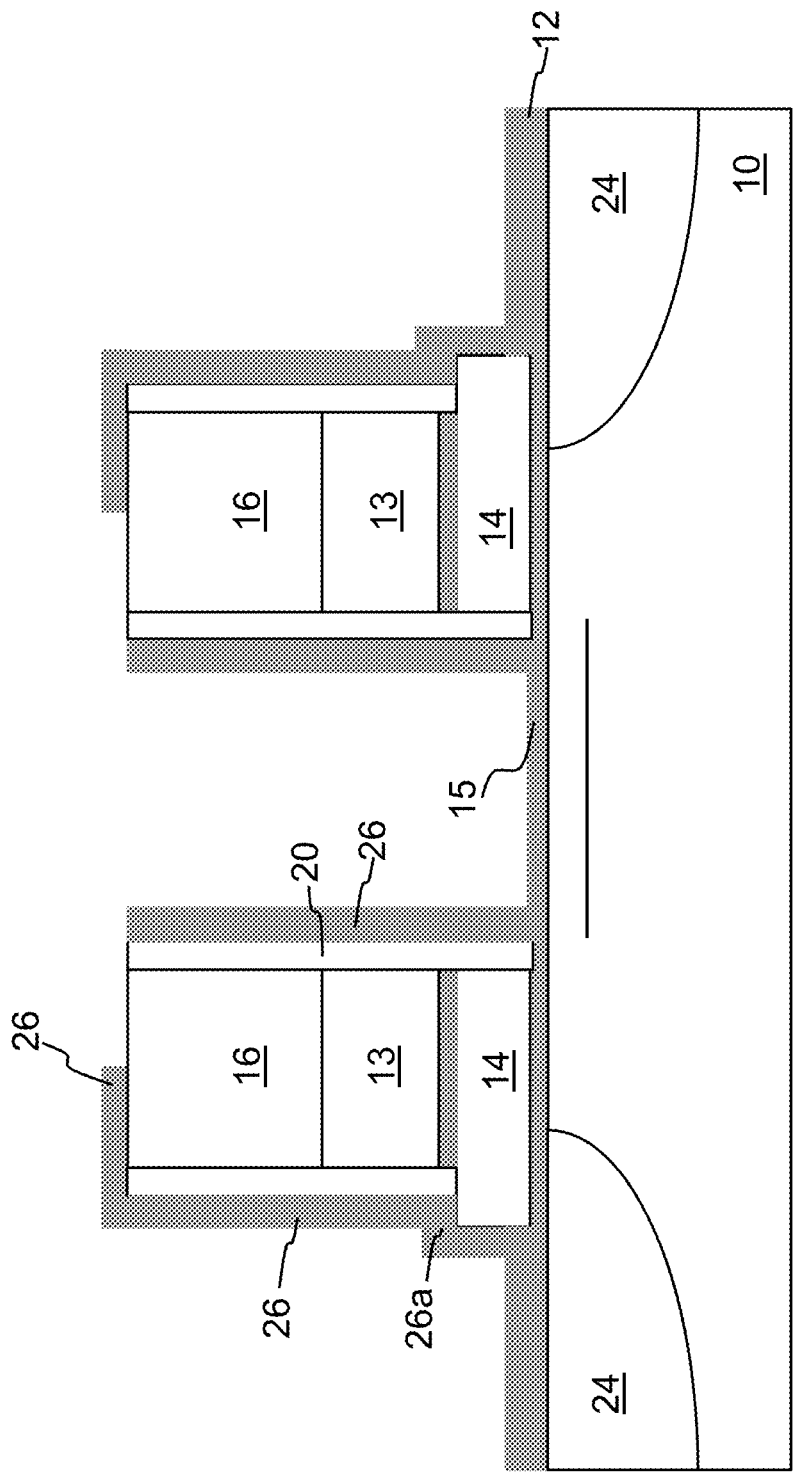
Figure 3C:
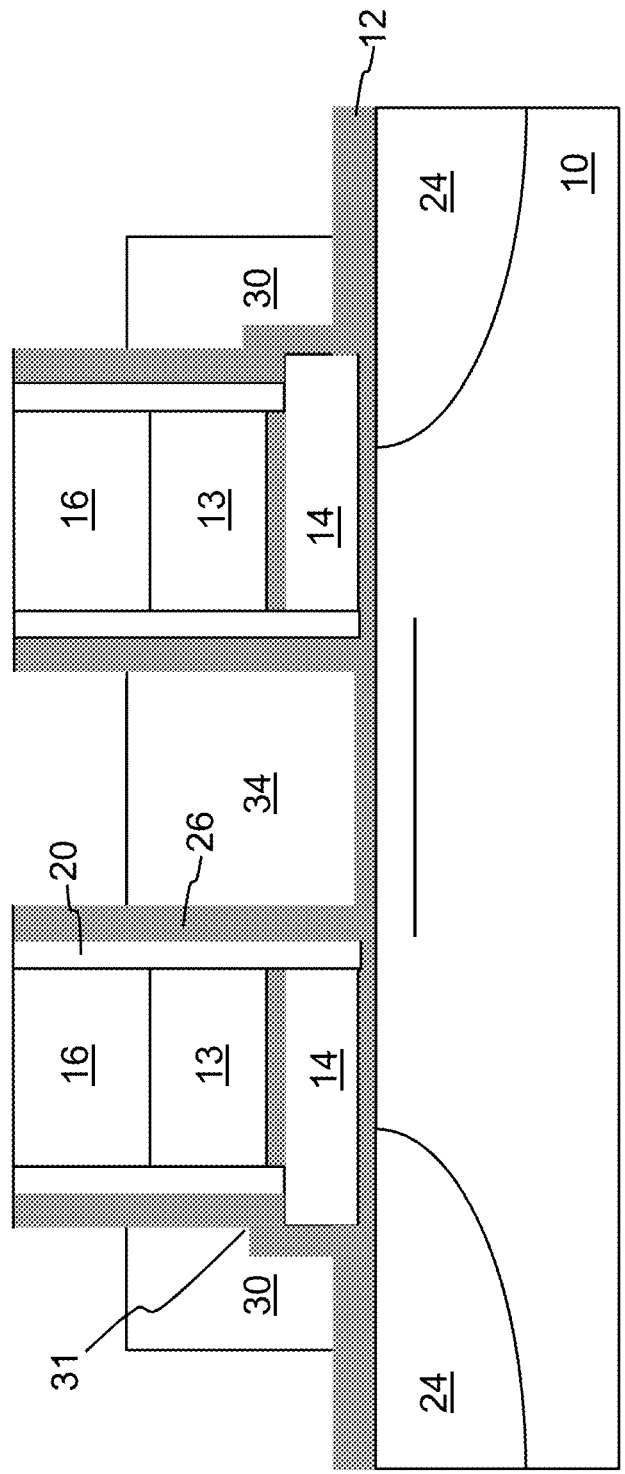

FIGS. 3A-3C illustrate an alternate embodiment for forming the 2-bit memory cell, which starts with the structure in FIG. 1D. A sacrificial oxide spacer 25 is formed. A photoresist coating and photolithography masking step is used to cover the inner region with photoresist 22. A poly etch is then used to remove the exposed portions of poly layer 14 in the outer regions. An implant process (e.g. implantation and anneal) is then performed to form drain regions (bit lines—BL) 24 in the substrate in the outer regions. Thereafter, an oxide wet etch is performed to remove spacer 25 in the outer regions, as shown in FIG. 3A. After removal of photoresist 22, oxide 26 is formed such that oxide layer 26 includes a stepped contour 26a. A photoresist coating and photolithography masking step is used to cover the structure with photoresist except for the inner region. An oxide anisotropic etch is then used to remove the oxide over the substrate 10. After removal of photoresist, an oxide layer 15 is grown over the structure in the inner region, which thickens oxide layer 12 over the substrate 10 in the outer regions, as shown in FIG. 3B. The remaining processing steps described above with respect to FIGS. 1G and 1H are performed, resulting in the structure shown in FIG. 3C. The erase gates 30 have a notch 31 facing a corner of the floating gate 14 for enhanced erase operation performance.

Figure 4B:
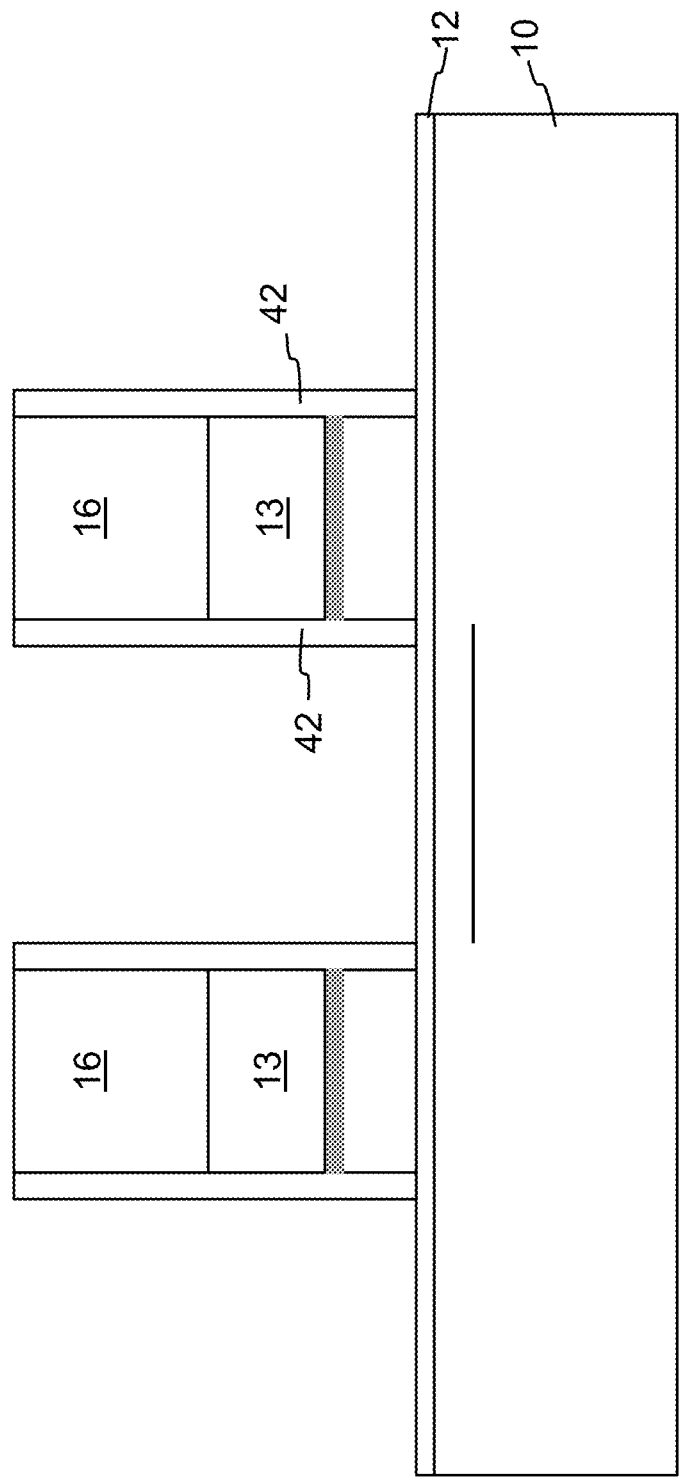
Figure 4C:
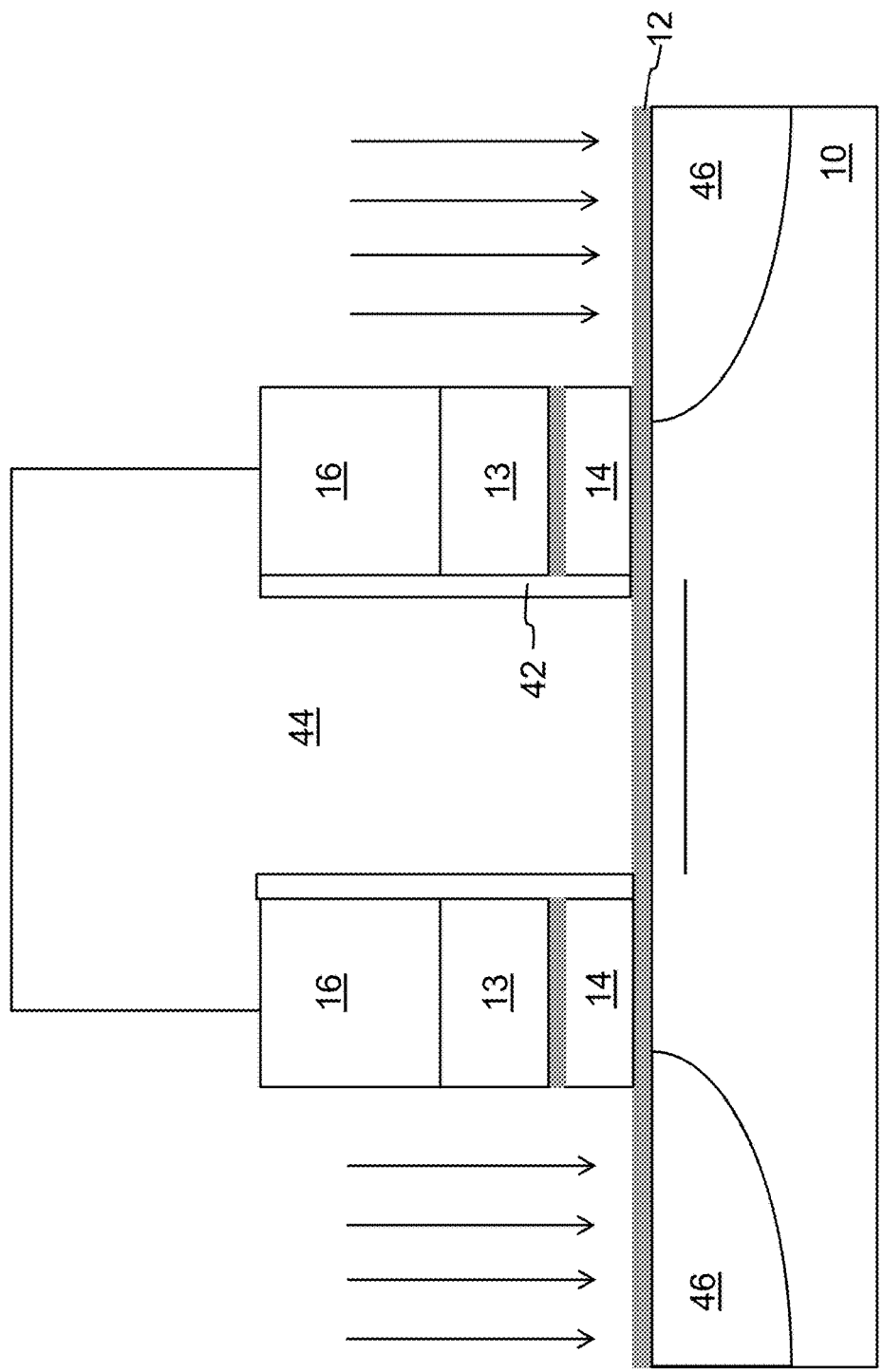

FIGS. 4A to 4D illustrate another embodiment for forming the 2-bit memory cell, which starts with the structure of FIG. 1B, as shown in FIG. 4A. A poly etch is used to remove the exposed poly layer 14 portions in the inner and the outer regions, instead of just in the inner region, leaving poly blocks 14. Spacers 42 (e.g. oxide or oxide-nitride) are formed along the sides of the structure, and a WLVT implantation is used to implant the substrate in the inner region, as shown in FIG. 4B. Photo resist 44 is formed covering the inner region, and spacers 42 facing the outer regions are removed. An implant is then used form drain regions 46, as illustrated in FIG. 4C.

Figure 4D:
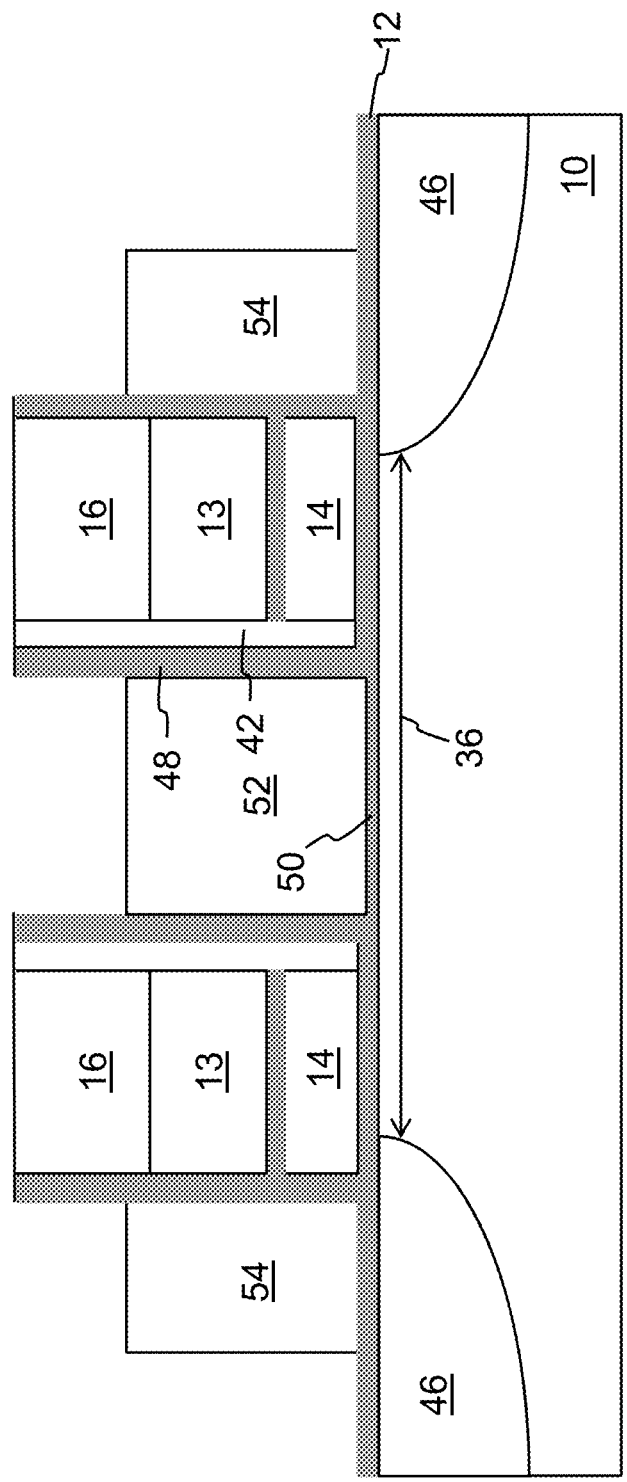

After removal of photoresist 44, oxide 48 is formed on the structure, which removes exposed portions of oxide layer 12 on the substrate. A photoresist coating and photolithography masking process is used to open the inner region, but leave the outer regions covered by photoresist. A oxide anisotropic etch is then used to remove the oxide 12 over the substrate 10 in the inner region. After removal of the photoresist, an oxide layer 50 (e.g. by thermal oxidation) is grown in the inner region, which thickens oxide layer 12 over the substrate 10 in the outer regions. A polysilicon deposition and etch back or CMP is used to form a layer of polysilicon in the inner and outer regions. A photoresist coating and photolithography masking, and polysilicon etch, are used to define the outer edges of the polysilicon layer in the outer regions. The resulting structure is shown in FIG. 4D (after photoresist removal), which results in poly block 52 in the inner region and poly blocks 54 in the outer regions. Optionally, poly block 52 and oxide 48 and 50 in the inner region could be replaced with a high K insulator and metal block as described above. The advantages of this embodiment include that the floating gate poly blocks 14 are defined with a single poly etch, and the insulation between the floating gate and the word line gate 52 on one side and the erase gate 54 on the other side can be independently varied (i.e. by the inclusion of spacer 42 on just one side of the floating gate).

Figure 5A:
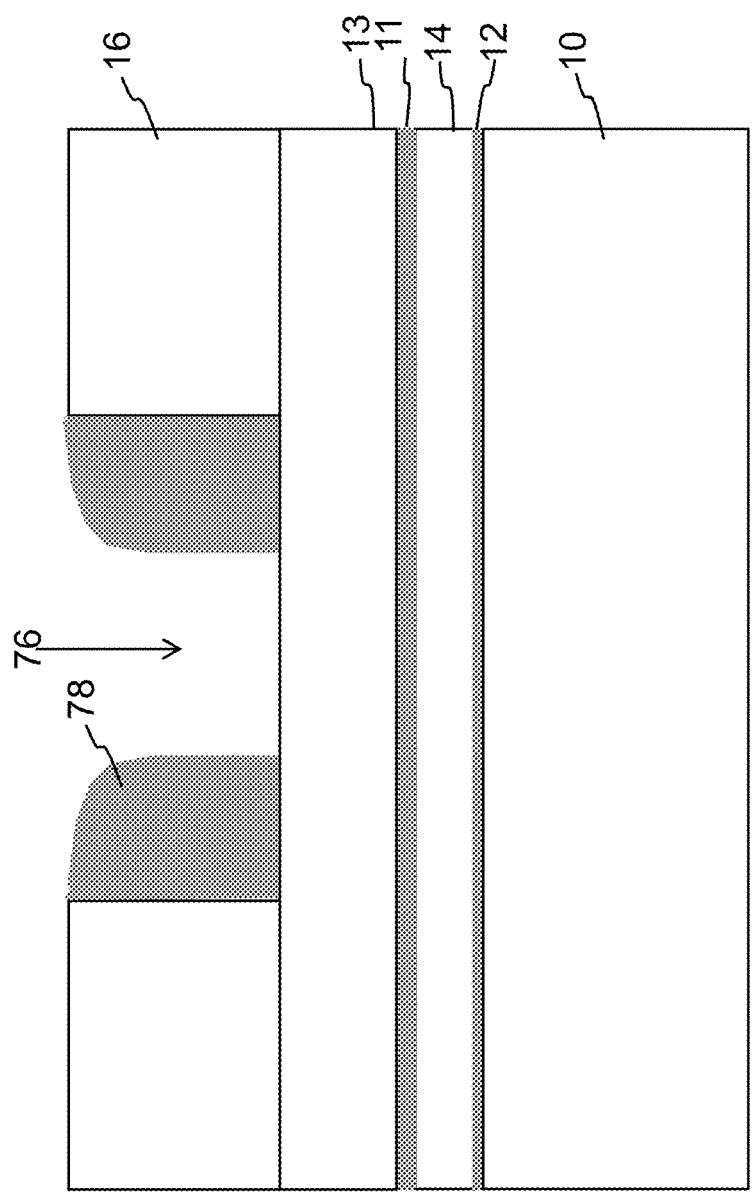
FIGS. 5A-5D are side cross section views showing the steps in forming an alternate embodiment of the 2 bit memory cell of the present invention.
Figure 5B:
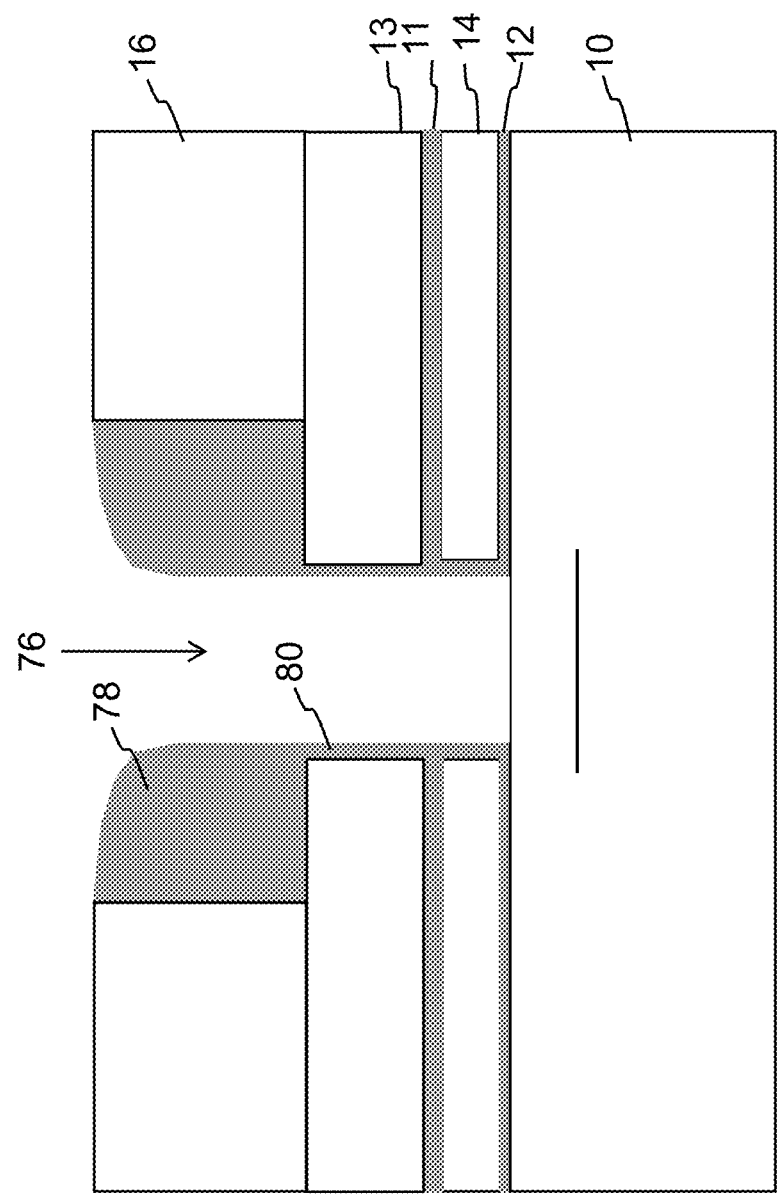
Figure 5C:
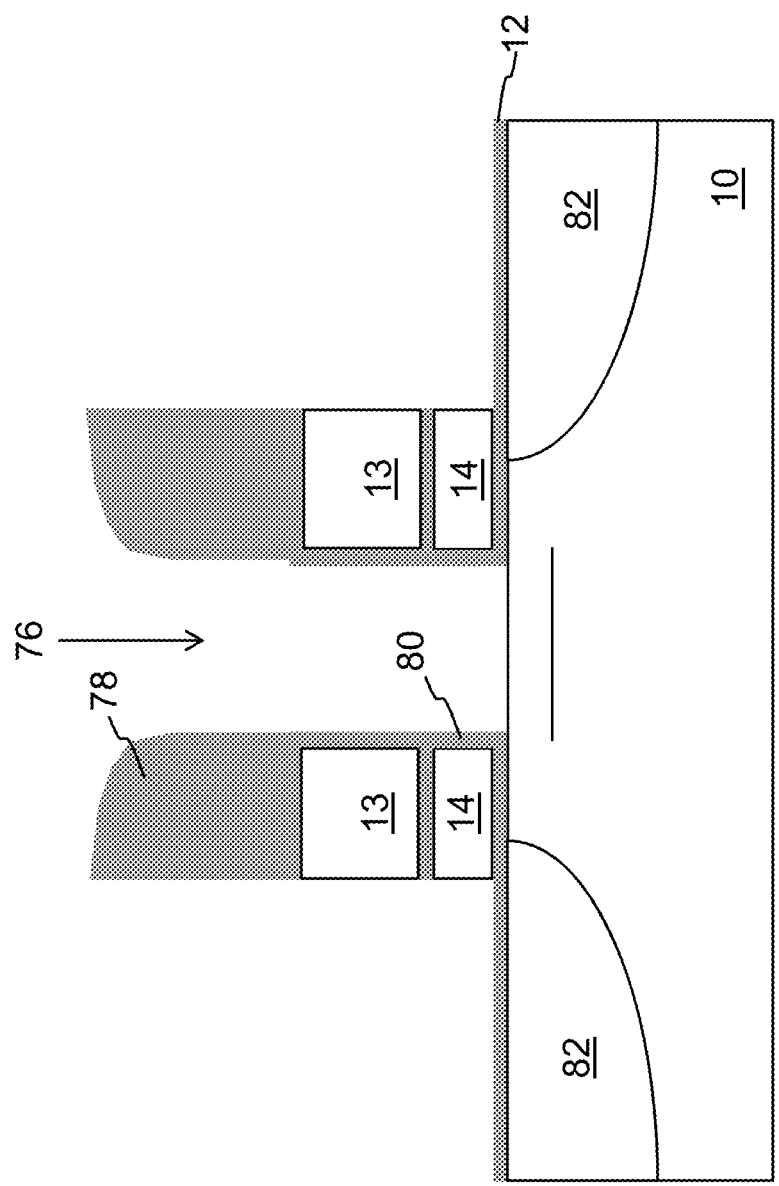
Figure 5D:
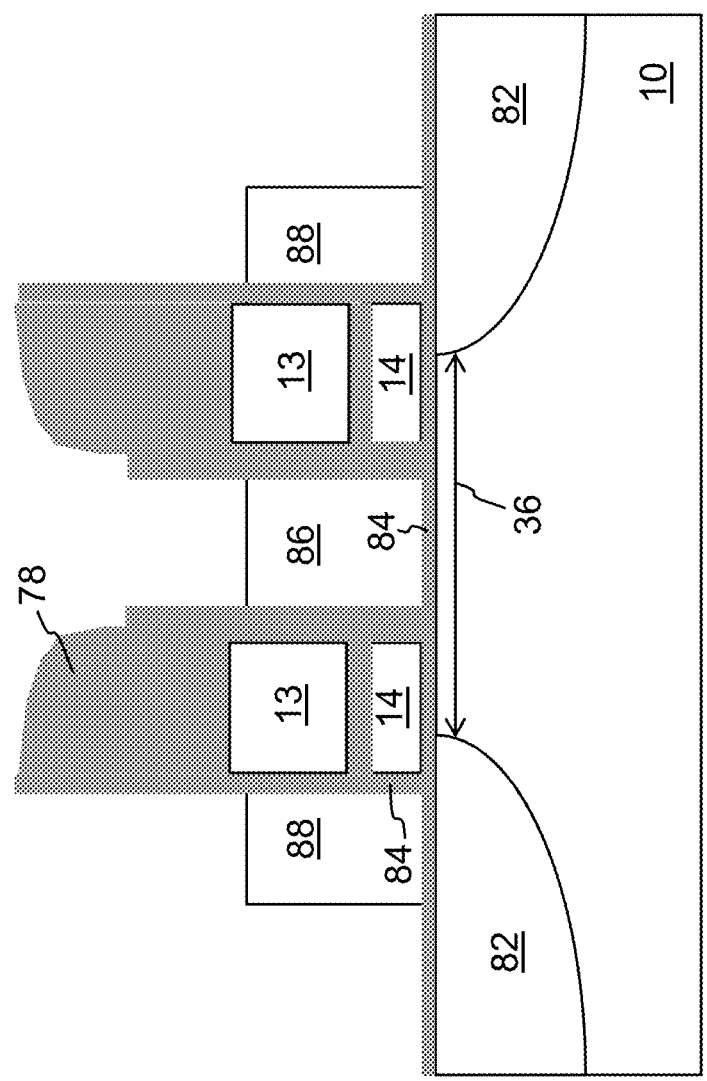

FIGS. 5A-5D illustrate another embodiment for forming the 2-bit memory cell, which begins with the structure of FIG. 1A. A photolithography and nitride etch process are used to form a trench 76 in the nitride layer 16. Oxide spacers 78 are formed on the trench sidewalls by oxide deposition and etch, as shown in FIG. 5A. A poly etch is performed to remove the exposed portion of poly layer 14 in trench 76. A WLVT implantation is used to implant the substrate under trench 76. An oxide deposition and etch is used to form spacers 80 along the exposed sides of poly layer 14, as shown in FIG. 5B. A nitride etch is used to remove nitride layer 16. A poly etch is used to remove exposed portions of poly layer 14. Photoresist is coated on the structure and selectively removed except for trench 76, and an implant process is used to form drain regions 82, as illustrated in FIG. 5C (after photoresist removal). Oxide layer 84 is formed on the exposed ends of poly layer 14 and exposed substrate in trench 76 (e.g. thermal oxide). A poly deposition and etch are performed to form poly block (word line gate) 86 in trench 76, and poly blocks (erase gates) 88 along the outer sides of floating gate blocks 14, as illustrated in FIG. 5D.

Figure 6A:
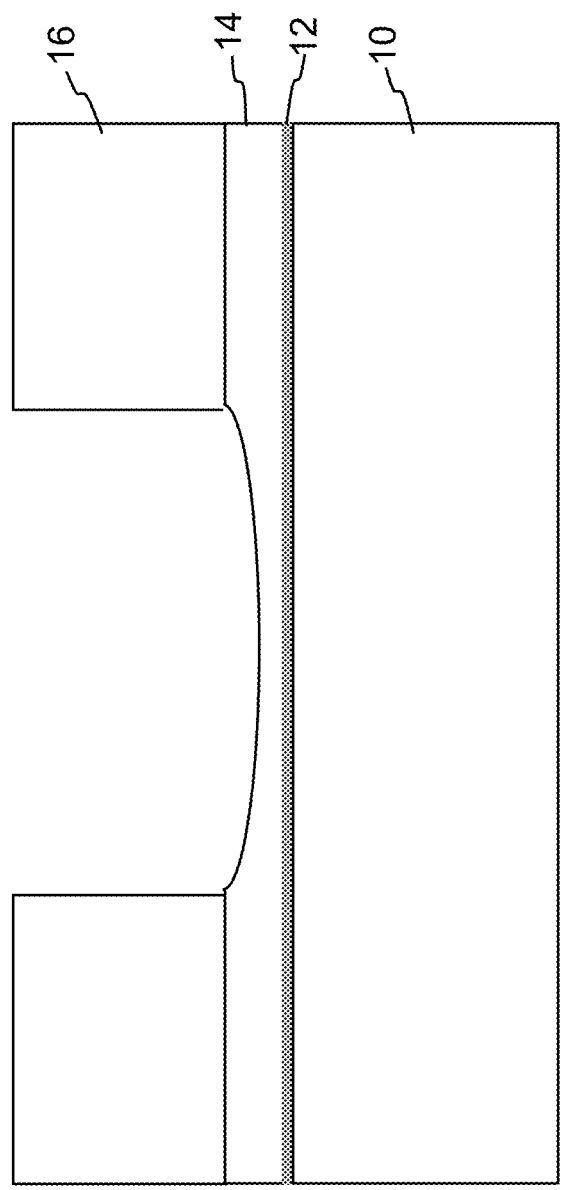
FIGS. 6A-6D are side cross section views showing the steps in forming an alternate embodiment of the 2 bit memory cell of the present invention.
Figure 6B:
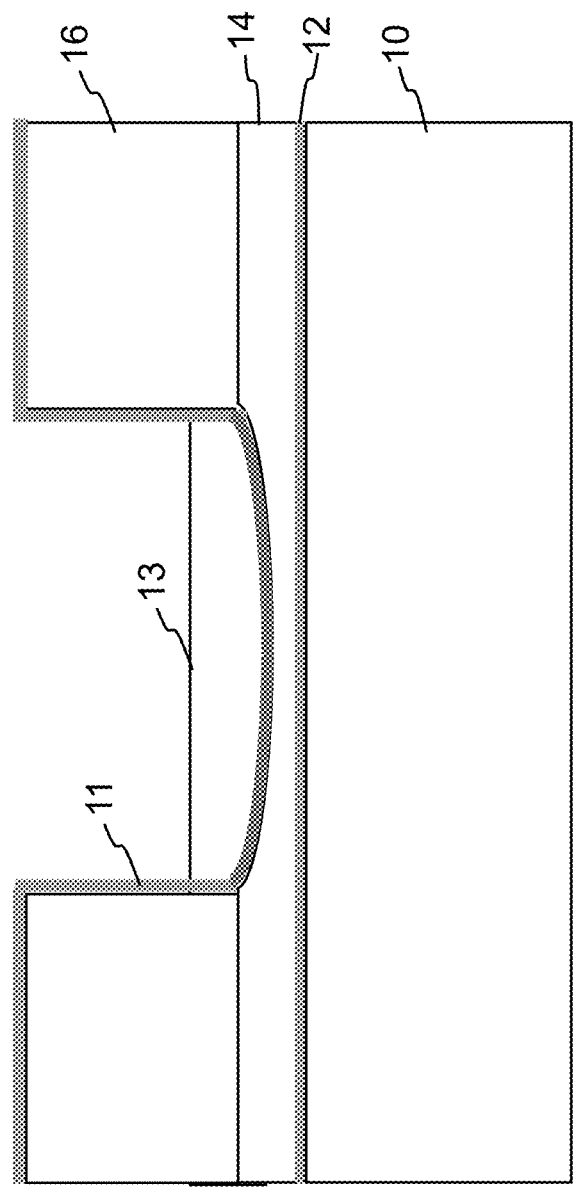
Figure 6C:
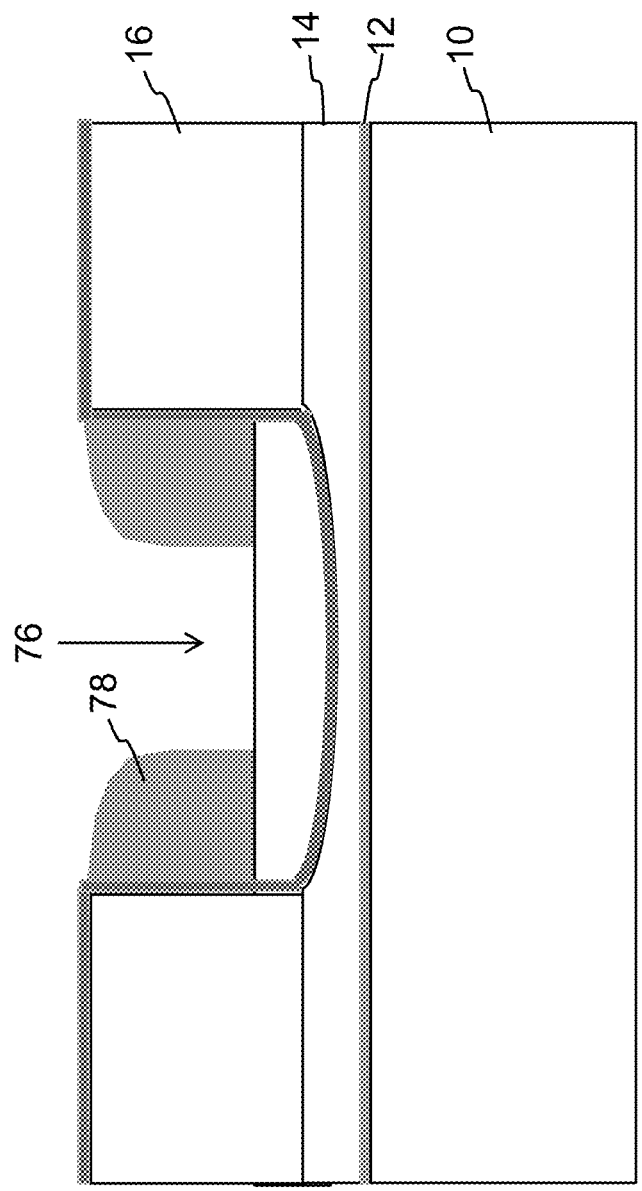
Figure 6D:
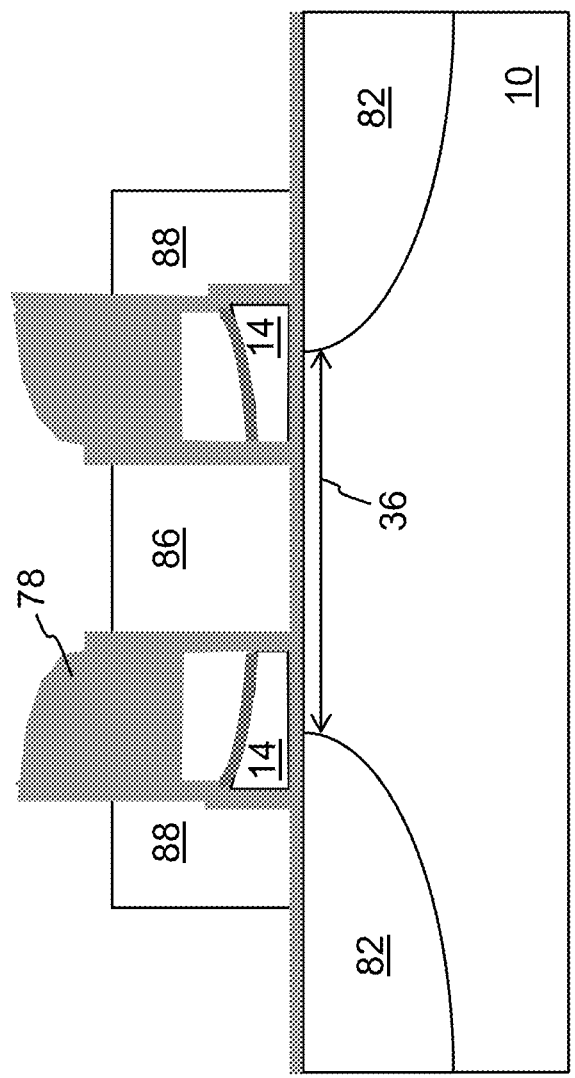

FIGS. 6A-6D illustrate an alternate embodiment of the process of FIGS. 5A-5D, wherein before spacers 78 are formed, a poly slope etch is performed so that the upper surface of poly layer 14 slopes downwardly as it extends away from nitride layer 16, as shown in FIG. 6A. ONO layer 11 is formed over the structure, and poly layer 13 is formed on ONO layer by poly deposition and etch back, as shown in FIG. 6B. Spacers 78 are then formed on poly layer 13, as shown in FIG. 6C. The remaining processing steps described above with respect to FIGS. 5B to 5D are then performed, resulting in each floating gate having an upwardly sloping surface terminating in a sharper edge that faces the notch of the erase gate, as shown in FIG. 6D.

Figure 7:
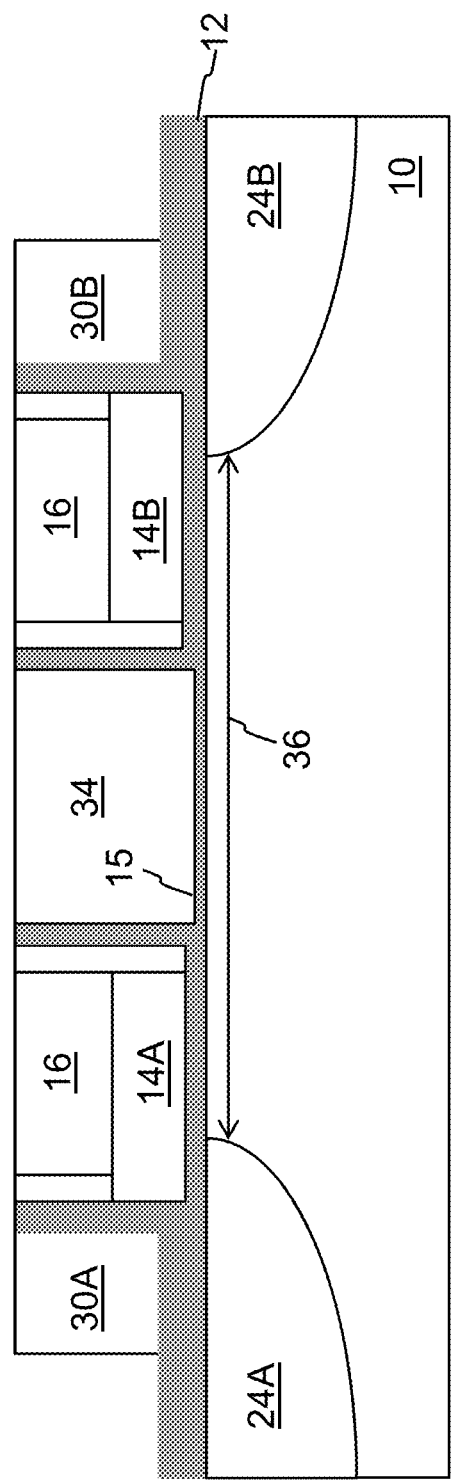
FIG. 7 is a side cross section view showing an alternate embodiment of the 2 bit memory cell of the present invention.

FIG. 7 illustrates an alternate embodiment for the 2 bit memory cell of FIG. 1H, where the memory cell does not include a coupling gate. Formation of the memory cell of FIG. 7 is similar to that disclosed with respect to FIGS. 1A-1H, except omitting the formation of the ONO layer 11 and second poly layer 13 before the formation of nitride layer 16 (see FIG. 1A). The operational voltages for the 2 bit memory cell of FIG. 7 are illustrated in Table 2 below:

TABLE 2

|  | EG 30A | EG 30B | WL 34 | BL 24A | BL 24B |
| --- | --- | --- | --- | --- | --- |
| Program bit 1 | HV1 | 0 | 1 V | HV2 | −1 uA |
| Program bit 2 | 0 | HV1 | 1 V | −1 uA | HV2 |
| Read bit 1 | 0 | Vegr | Vcc | 0 | Vblr |
| Read bit 2 | Vegr | 0 | Vcc | Vblr | 0 |
| Erase both bits | 11.5 V | 11.5 V | 0 | 0 | 0 |

Control circuitry 96 preferably (but not necessarily) formed on the same substrate 10 (as shown in FIG. 8) is configured program, read and erase an array 98 of the 2-bit memory cells described herein by applying the voltages of Table 1 or Table 2.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the memory cell array of the present invention. Lastly, single layers of material could be formed as multiple layers of such or similar materials, and vice versa.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:

1. A method of forming a pair of non-volatile memory cells comprising:
    forming a first insulation layer on a semiconductor substrate;
    forming a first polysilicon layer on the first insulation layer in a first polysilicon deposition process;
    forming spaced apart first and second insulation blocks on the first polysilicon layer, the first insulation block having a first side facing the second insulation block and a second side facing away from the second insulation block, and the second insulation block having a first side facing the first insulation block and a second side facing away from the first insulation block;
    removing a portion of the first polysilicon layer disposed between the first and second insulation blocks while maintaining portions of the first polysilicon layer disposed underneath the first and second insulation blocks and adjacent the second sides of the first and second insulation blocks;
    removing the portions of the first polysilicon layer adjacent the second sides of the first and second insulation blocks while maintaining a pair of polysilicon blocks of the first polysilicon layer each disposed under one of the first and second insulation blocks;
    forming a first drain region in the substrate and adjacent the second side of the first insulation block;
    forming a second drain region in the substrate and adjacent the second side of the second insulation block;
    forming a second polysilicon layer over the substrate and the first and second insulation blocks in a second polysilicon deposition process; and
    removing portions of the second polysilicon layer while maintaining a first polysilicon block, a second polysilicon block and a third polysilicon block of the second polysilicon layer, wherein:
        the first polysilicon block is disposed between the first and second insulation blocks,
        the second polysilicon block is disposed over the first drain region, and
        the third polysilicon block is disposed over the second drain region;
    wherein the substrate includes a continuous channel region extending between the first and second drain regions.

2. The method of claim 1, wherein one of the pair of polysilicon blocks is partially disposed over and insulated from the first drain region, and the other one of the pair of polysilicon blocks is partially disposed over and insulated from the second drain region.

3. The method of claim 1, wherein the second polysilicon block includes a notch facing an edge of the first floating gate, and wherein the second erase gate includes a notch facing an edge of the second floating gate.

4. The method of claim 1, further comprising:
    forming a fourth polysilicon block that is disposed over and insulated from one of the pair of polysilicon blocks and under the first insulation block;
    forming a fifth polysilicon block that is disposed over and insulated from the other one of the pair of polysilicon blocks and under the second insulation block.

5. The method of claim 1, further comprising:
removing the first polysilicon block;
forming a metal block between the first and second insulation blocks; and
forming a layer of high-K insulation material between the metal block and the substrate and between the metal block and the first and second insulation blocks.

6. The method of claim 1, wherein the first and second insulation blocks are spacers.

7. The method of claim 1, wherein before the forming of the first and second insulation blocks, further comprising:
performing a poly slope etch to an upper surface of the first polysilicon layer, such that the upper surface included downwardly sloping portions, wherein the first and second insulation blocks are formed on the sloping portions.

8. A method of forming a pair of non-volatile memory cells comprising:
forming a first insulation layer on a semiconductor substrate;
forming a first polysilicon layer on the first insulation layer in a first polysilicon deposition process;
forming an insulation layer stack on the first polysilicon layer;
forming a second polysilicon layer on the insulation layer stack;
forming spaced apart first and second insulation blocks on the second polysilicon layer, the first insulation block having a first side facing the second insulation block and a second side facing away from the second insulation block, and the second insulation block having a first side facing the first insulation block and a second side facing away from the first insulation block;
removing portions of the second polysilicon layer, the insulation layer stack and the first polysilicon layer disposed between the first and second insulation blocks and adjacent the second sides of the first and second insulation blocks, while maintaining a pair of polysilicon blocks of the first polysilicon layer each disposed under one of the first and second insulation blocks;
forming a first drain region in the substrate and adjacent the second side of the first insulation block;
forming a second drain region in the substrate and adjacent the second side of the second insulation block;
forming a third polysilicon layer over the substrate and the first and second insulation blocks in a second polysilicon deposition process; and
removing portions of the third polysilicon layer while maintaining a first polysilicon block, a second polysilicon block and a third polysilicon block of the third polysilicon layer, wherein:
the first polysilicon block is disposed between the first and second insulation blocks,
the second polysilicon block is disposed over the first drain region, and
the third polysilicon block is disposed over the second drain region;
wherein the substrate includes a continuous channel region extending between the first and second drain regions.

9. The method of claim 8, further comprising:
forming first insulation between the first polysilicon block and the pair of polysilicon blocks;
forming second insulation between the second polysilicon block and one of the pair of polysilicon blocks;
forming third insulation between the third polysilicon block and the other of the pair of polysilicon blocks;
wherein the first insulation is thicker than the second insulation and the third insulation.

* * * * *